(12) United States Patent
Wang et al.

(10) Patent No.: US 11,519,786 B2
(45) Date of Patent: Dec. 6, 2022

(54) TEMPERATURE DETECTION CIRCUIT, TEMPERATURE SENSOR DEVICE AND DISPLAY DEVICE

(71) Applicant: BOE TECHNOLOGY GROUP CO., LTD., Beijing (CN)

(72) Inventors: Pengpeng Wang, Beijing (CN); Xue Dong, Beijing (CN); Haisheng Wang, Beijing (CN); Chunwei Wu, Beijing (CN); Xiaoliang Ding, Beijing (CN); Chihjen Cheng, Beijing (CN); Yanling Han, Beijing (CN); Wei Liu, Beijing (CN); Xueyou Cao, Beijing (CN); Ping Zhang, Beijing (CN); Lijun Zhao, Beijing (CN)

(73) Assignee: BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 1098 days.

(21) Appl. No.: 16/120,642

(22) Filed: Sep. 4, 2018

(65) Prior Publication Data
US 2019/0094077 A1    Mar. 28, 2019

(30) Foreign Application Priority Data

Sep. 25, 2017  (CN) .......................... 201710875799.2

(51) Int. Cl.
*G01K 1/02*    (2021.01)
*H02H 1/00*    (2006.01)
(Continued)

(52) U.S. Cl.
CPC ................ *G01K 1/02* (2013.01); *G01K 7/32* (2013.01); *H02H 1/0007* (2013.01); *H02H 9/042* (2013.01); *H03K 5/24* (2013.01)

(58) Field of Classification Search
CPC .......... G01K 1/02; G01K 7/32; H02H 1/0007; H02H 9/042; H03K 5/24; H03K 5/04; H03K 19/017509
(Continued)

(56) References Cited

U.S. PATENT DOCUMENTS 6,409,677 B1 *  6/2002  Tulkki ..................... A61B 5/01
                                                             600/549

FOREIGN PATENT DOCUMENTS

CN         1084280         3/1994
CN         2573693         7/2003
(Continued)

OTHER PUBLICATIONS

Office action from Chinese Application No. 201710875799.2 dated Jun. 22, 2020.

*Primary Examiner* — Lisa M Caputo
*Assistant Examiner* — Janice M Soto
(74) *Attorney, Agent, or Firm* — Calfee, Halter & Griswold LLP

(57) ABSTRACT

The present disclosure provides a temperature detection circuit. The temperature detection circuit includes: a first comparator, the first comparator having a first negative input terminal, a first positive input terminal and a first output terminal, the first negative input terminal being connected with an output terminal of a temperature sensor, the first positive input terminal being connected with a first reference voltage terminal; a monostable trigger, an input terminal of the monostable trigger being connected with the first output terminal of the first comparator; a low pass filter, an input terminal of the low pass filter being connected with an output terminal of the monostable trigger. The present disclosure further provides a temperature sensor device and a display device.

20 Claims, 2 Drawing Sheets

(51) Int. Cl.
*H03K 5/24* (2006.01)
*H02H 9/04* (2006.01)
*G01K 7/32* (2006.01)

(58) Field of Classification Search
USPC ......... 374/100, 163, 178, 170–173; 327/512, 327/513
See application file for complete search history.

(56) References Cited

FOREIGN PATENT DOCUMENTS

| | | | | |
|---|---|---|---|---|
| CN | 2573693 | | 9/2003 | |
| CN | 101221894 | | 7/2008 | |
| EP | 208530 | | 1/1987 | |
| EP | 393814 | | 10/1990 | |
| EP | 0530997 A1 | * | 3/1993 | ......... G05D 23/1913 |
| JP | 2010141682 A | * | 6/2010 | |

* cited by examiner

TEMPERATURE DETECTION CIRCUIT, TEMPERATURE SENSOR DEVICE AND DISPLAY DEVICE

FIELD

The present disclosure relates to the field of display technology, and in particular to a temperature detection circuit, a temperature sensor device and a display device.

BACKGROUND

Since the screen integrated temperature sensor has the advantage of not requiring additional extra temperature sensor(s) and being capable of detecting the temperature of the screen as long as being in contact with the screen, and is convenient to use and thus has been widely applied.

In the prior art, the temperature sensor is generally constituted by a ring oscillator, and the temperature detection circuit generally comprises a comparator connected with the ring oscillator. The AC signal output by the ring oscillator is shaped into a square wave signal through the comparator, and the square wave signal is counted by a processor, so as to obtain a frequency of the ring oscillator, and obtain the current screen temperature based on the frequency.

However, since generally the master clock frequency of the processor is limited, when the output frequency of the oscillator is relatively high (reaching above MHZ), it is difficult for the processor to count correctly, causing the temperature detection circuit fail to detect the temperature accurately.

SUMMARY

In an aspect, an embodiment of the present disclosure provides a temperature detection circuit, comprising:

a first comparator, the first comparator having a first negative input terminal, a first positive input terminal and a first output terminal, the first negative input terminal being connected with an output terminal of a temperature sensor, the first positive input terminal being connected with a first reference voltage terminal;

a monostable trigger, an input terminal of the monostable trigger being connected with the first output terminal of the first comparator; and a low pass filter, an input terminal of the low pass filter being connected with an output terminal of the monostable trigger.

In one embodiment, the temperature detection circuit further comprises a differential circuit.

The first output terminal of the first comparator is connected with the input terminal of the monostable trigger through the differential circuit.

In one embodiment, the monostable trigger comprises a second comparator, a first capacitor, a first thin film transistor, a second thin film transistor and a Zener diode. The second comparator has a second negative input terminal, a second positive input terminal and a second output terminal.

The second negative input terminal is connected with an output terminal of the differential circuit. The second positive input terminal is connected with a second reference voltage terminal through a first resistor. The second positive input terminal is further connected with a drain of the first thin film transistor through a second resistor. The second positive input terminal is further connected with a ground terminal through the first capacitor. The second output terminal is connected with a gate of the first thin film transistor through a first voltage dividing circuit. The second output terminal is further connected with a gate of the second thin film transistor through a second voltage dividing circuit.

A source of the first thin film transistor is connected with the ground terminal.

A drain of the second thin film transistor is connected with the second reference voltage terminal through a third resistor. The drain of the second thin film transistor is further connected with the second negative input terminal through a third voltage dividing circuit. A source of the second thin film transistor is connected with the ground terminal.

A positive pole of the Zener diode is connected with the source of the second thin film transistor, and a negative pole of the Zener diode is connected with the drain of the second thin film transistor.

In one embodiment, the differential circuit further comprises a second capacitor and a fourth resistor.

A first terminal of the second capacitor is connected with the first output terminal of the first comparator, and a second terminal of the second capacitor is connected with the second negative input terminal of the second comparator.

The fourth resistor is connected between the second terminal of the second capacitor and the ground terminal.

In one embodiment, the second terminal of the second capacitor is connected with the second negative input terminal of the second comparator through a first diode.

The second output terminal of the second comparator is connected with the first voltage dividing circuit through a second diode, and the second output terminal is further connected with the second voltage dividing circuit through the second diode.

In one embodiment, the temperature detection circuit further comprises a amplitude limiter.

The first negative input terminal of the first comparator is connected with an output terminal of the amplitude limiter, and the first negative input terminal is connected with the output terminal of the temperature sensor through the amplitude limiter.

In one embodiment, the amplitude limiter comprises a third diode and a fourth diode.

A positive pole of the third diode is connected with the first negative input terminal of the first comparator, and a negative pole of the third diode is connected with a third reference voltage terminal.

A negative pole of the fourth diode is connected with the first negative input terminal of the first comparator, and a positive pole of the fourth diode is connected with a fourth reference voltage terminal.

In another aspect, an embodiment of the present disclosure further provides a temperature sensor device, comprising a temperature sensor and the temperature detection circuit as previously described.

The output terminal of the temperature sensor is connected with the first negative input terminal of the first comparator.

In one embodiment, the temperature sensor device further comprises a high pass filter circuit. The output terminal of the temperature sensor is connected with the high pass filter circuit.

The output terminal of the temperature sensor is connected with the first negative input terminal of the first comparator through the high pass filter circuit.

In another aspect, an embodiment of the present disclosure further provides a display device, comprising the temperature sensor device as previously described.

In the technical solution according to an embodiment of the present disclosure, the first negative input terminal of the first comparator is connected with the output terminal of the temperature sensor, and the first positive input terminal of the first comparator is connected with a reference voltage terminal. The first output terminal of the first comparator is connected with the input terminal of the monostable trigger, and the output terminal of the monostable trigger is connected with the input terminal of the low pass filter. In this way, the first comparator shapes the output signal of the temperature sensor into a square wave, and the monostable trigger generates a pulse signal that has the same frequency as the square wave, and has a fixed width which is smaller than the width of the square wave, the low pass filter converts the pulse signal with a fixed width into a frequency dependent DC voltage signal, and the processor performs collecting processing on the frequency dependent DC voltage signal, so as to obtain a current temperature of the screen. Compared with the prior art, the technical solution provided by the embodiment of the present disclosure discards the conventional way of detecting the temperature by counting, but obtains the temperature value by collecting the voltage signal. Thus, the master clock frequency of the processor is not required, which allows the temperature detection circuit to have a relatively wide frequency collecting range. Even if the output frequency of the temperature sensor is relatively high, the temperature detection circuit may also detect the temperature accurately.

EMBODIMENTS

The specific implementations, structures, features and effects of the temperature detection circuit, the temperature sensor device and the display device will be explained in detail below with reference to the drawings and various embodiments. In the following, different "one embodiment" or "an embodiment" does not necessarily refer to an identical embodiment. In addition, particular features or structures in one or more embodiments may be combined in any appropriate form.

Figure 1:
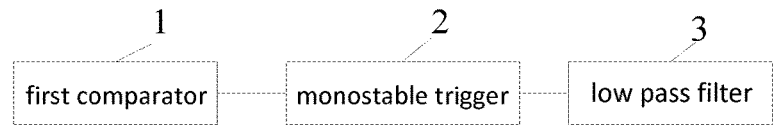
FIG. 1 is a structure block diagram of a temperature detection circuit according to an embodiment of the present disclosure.
Figure 3:
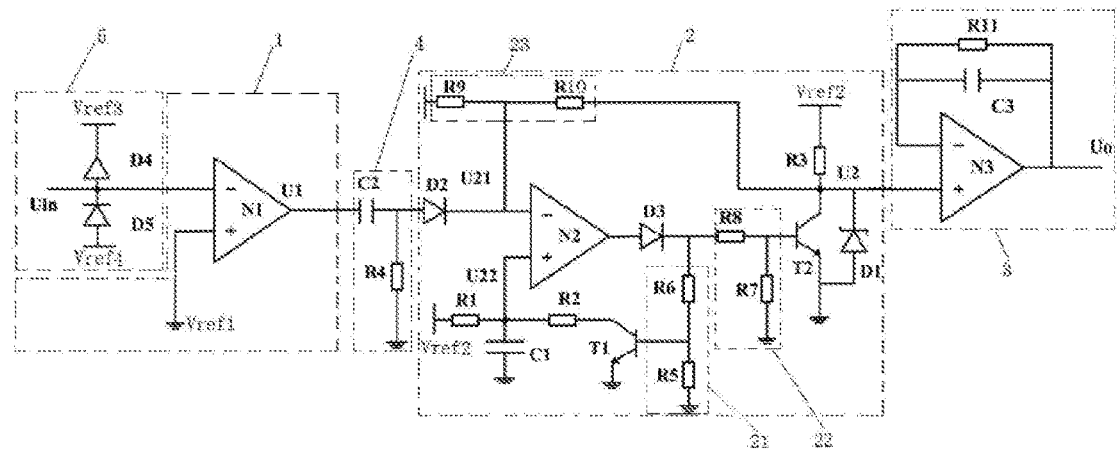
FIG. 3 is a circuit diagram of a temperature detection circuit according to an embodiment of the present disclosure.

As shown in FIG. 1 and FIG. 3, an embodiment of the present disclosure provides a temperature detection circuit, comprising a first comparator 1 (N1), a monostable trigger 2 and a low pass filter 3. The first comparator 1 has a first negative input terminal, a first positive input terminal and a first output terminal. The first negative input terminal is connected with an output terminal of a temperature sensor, and the first positive input terminal is connected with a first reference voltage terminal Vref1. An input terminal of the monostable trigger 2 is connected with the first output terminal of the first comparator 1. An input terminal of the low pass filter 3 is connected with an output terminal of the monostable trigger 2.

The first comparator 1 may use a hysteresis comparator to suppress ringing interference of the output signal of the temperature sensor, so as to ensure accuracy of the output frequency. The AC signal output by the temperature sensor is shaped into a square wave signal having a frequency equal thereto through the first comparator 1. The monostable trigger 2 outputs a pulse signal having the same frequency as the square wave signal and having a fixed width which is smaller than the width of the square wave signal through delay of resistor and capacitor. The low pass filter 3 converts the pulse signal with a fixed width into a frequency dependent DC voltage signal and outputs it. The processor may perform data processing to the frequency dependent DC voltage signal so as to obtain a frequency value, and then obtain a current temperature value based on the frequency value. In this way, the temperature detection circuit may have a relatively wide frequency collecting range. The width of the pulse signal may be further reduced by adjusting the values of resistance and capacitance in the monostable trigger 2, so that the detection circuit may have a wider frequency collecting range.

In the temperature detection circuit according to an embodiment of the present disclosure, the first negative input terminal of the first comparator is connected with the output terminal of the temperature sensor, and the first positive input terminal is connected with the first reference voltage. The first output terminal is connected with the input terminal of the monostable trigger, and the output terminal of the monostable trigger is connected with the input terminal of the low pass filter. In this way, the first comparator shapes the output signal of the temperature sensor into a square wave, and the monostable trigger generates a pulse signal having the same frequency as the square wave having a fixed width which is smaller than the width of the square wave. The low pass filter converts the pulse signal with a fixed width into a frequency dependent DC voltage signal, and the processor performs collecting processing on the frequency dependent DC voltage signal, so as to obtain a current temperature. Compared with the prior art, the technical solution provided by the embodiment of the present disclosure discards the conventional way of detecting the temperature by counting, but obtains the temperature value by collecting the voltage signal. Thus, the master clock frequency of the processor is not required, which allows the temperature detection circuit to have a relatively wide frequency collecting range. Even if the output frequency of the temperature sensor is relatively high, the temperature detection circuit may also detect the temperature accurately.

Figure 2:
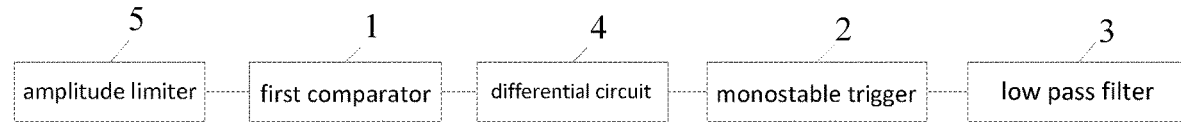
FIG. 2 is a structure block diagram of another temperature detection circuit according to an embodiment of the present disclosure.

Referring to FIG. 2 and FIG. 3, the temperature detection circuit further comprises a differential circuit 4. The first output terminal of the first comparator 1 is connected with the input terminal of the monostable trigger 2 through the differential circuit 4. The differential circuit 4 shapes the square wave signal output by the first comparator 1 into a pulse signal with a relatively small width. After the pulse signal with a relatively small width is inputted into the monostable trigger 2, the charging time of the capacitor in the monostable trigger 2 may be shortened, so that the monostable trigger 2 may generate a pulse signal having the same frequency as the square wave signal and having a fixed width and a smaller width, thereby further increases the frequency collecting range of the temperature detection circuit.

Figure 4:
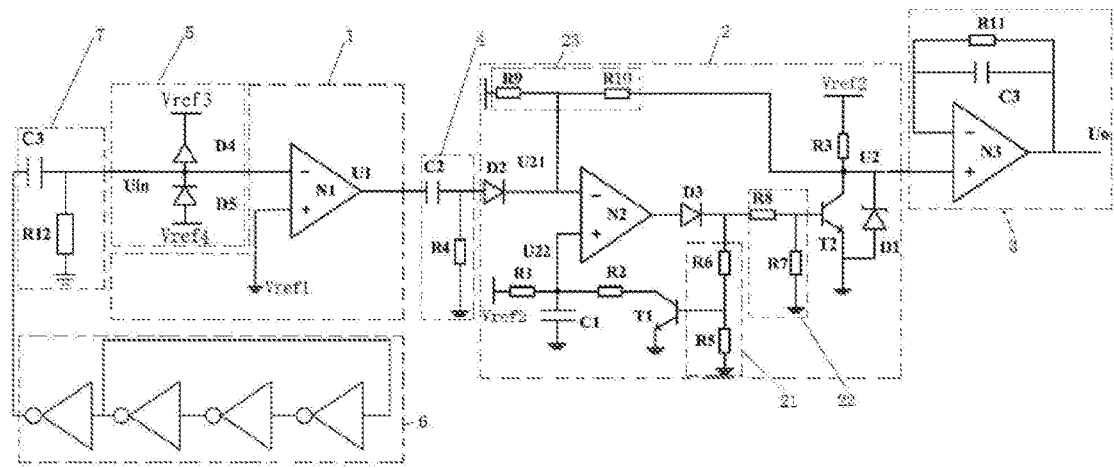
FIG. 4 is a circuit diagram of a temperature sensor device according to an embodiment of the present disclosure.

Specifically, referring to FIG. 3 or FIG. 4, the monostable trigger 2 comprises a second comparator N2, a first capacitor C1, a first thin film transistor T1, a second thin film transistor T2 and a Zener diode D1. The second comparator N2 has a second negative input terminal, a second positive input terminal and a second output terminal. The second negative input terminal is connected with the output terminal of the differential circuit 4. The second positive input terminal is connected with a second reference voltage terminal Vref2 through a first resistor R1. The second positive input terminal is further connected with a drain of the first thin film transistor T1 through a second resistor R2. The second positive input terminal is further connected with the ground terminal through the first capacitor C1. The second output terminal is connected with a gate of the first thin film transistor T1 through a first voltage dividing circuit 21. The second output terminal is further connected with a gate of the second thin film transistor T2 through a second voltage dividing circuit 22. The source of the first thin film transistor T1 is connected with the ground terminal. The drain of the second thin film transistor T2 is connected with the second reference voltage terminal Vref2 through a third resistor R3. The drain of the second thin film transistor T2 is also connected with the second negative input terminal through the third voltage dividing circuit 23. The source of the second thin film transistor T2 is connected with the ground terminal. The positive pole of the Zener diode D1 is connected with the source of the second thin film transistor T2. The negative pole of the Zener diode D1 is connected with the drain of the second thin film transistor T2. The differential circuit 4 comprises a second capacitor C2 and a fourth resistor R4. The first terminal of the second capacitor C2 is connected with the first output terminal of the first comparator. The second terminal of the second capacitor C2 is connected with the second negative input terminal of the second comparator. The fourth resistor R4 is connected between the second terminal of the second capacitor C2 and the ground terminal. The first voltage dividing circuit 21 may comprise two resistors R5 and R6 connected in series between the second output terminal of the second comparator and the ground terminal. The gate of the first thin film transistor T1 is connected between the two resistors R5 and R6. The second voltage dividing circuit 22 may comprise two resistors R7 and R8 connected in series between the second output terminal of the second comparator and the ground terminal. The gate of the second thin film transistor T2 is connected between the two resistors R7 and R8. The third voltage dividing circuit 23 may comprise two resistors R9 and R10 connected in series between the drain of the second thin film transistor T2 and the ground terminal. The second negative input terminal of the second comparator is connected between the two resistors R9 and R10.

The working process of the monostable trigger 2 is:

First stage: when the potential of the square wave signal U1 output by the first output terminal of the first comparator 1 is at a low level, the potential of the pulse signal output from the differential circuit 4 is also at a low level. At this time, since the second positive input terminal U22 of the second comparator N2 is connected with the second reference voltage terminal Vref2, the potential of the second positive input terminal U22 of the second comparator N2 is greater than the potential of the second negative input terminal U21, such that the output signal of the second output terminal of the second comparator N2 is at a high level. The high level meets the turn-on conditions of the first thin film transistor T1 and the second thin film transistor T2, such that the first thin film transistor T1 and the second thin film transistor T2 are both turned on. At this time, the potential of the drain of the second thin film transistor T2, i.e., the output terminal U2 of the monostable trigger 2, is at a low level, and the frequency of the output signal is same as that of the input signal, the potential of the first positive input terminal U22 of the second comparator N2 is also at a low level.

Second stage: when the potential of the square wave signal U1 output by the first output terminal of the first comparator 1 is at a high level, the potential of the pulse signal output from the differential circuit 4 becomes a high level. At this time, since the potential of the second positive input terminal U22 of the second comparator N2 is at a low level, the potential of the second positive input terminal U22 of the second comparator N2 is less than that of the second negative input terminal U21, such that the output signal of the second output terminal of the second comparator N2 is at a low level. This low level could not meet the turn-on conditions of the first thin film transistor T1 and the second thin film transistor T2, such that the first thin film transistor T1 and the second thin film transistor T2 are both turned off. At this time, the second thin film transistor T2 is turned off, the second reference voltage terminal Vref2 enables the Zener diode D1 to turn on through the third resistor R3, so as to enable the output terminal U2 of the monostable trigger 2 to be a stable voltage of the Zener diode D1. Meanwhile, the pulse signal output from the differential circuit 4 remains at a high potential due to the voltage division action of the third voltage dividing circuit 23. The first thin film transistor T1 is turned off, the second reference voltage terminal Vref2 charges the first capacitor C1 through the first resistor R1, so as to enable the potential of the second positive input terminal U22 of the second comparator N2 to rise gradually. Until the potential of the second positive input terminal U22 of the second comparator N2 is higher than the potential of the pulse signal output from the differential circuit 4, the second output terminal of the second comparator N2 outputs a high level again, the first thin film transistor T1 and the second thin film transistor T2 are turned on again. The first stage is repeated, and the potential of the output terminal U2 of the monostable trigger 2 is at a low level, and thus the monostable process ends.

Specifically, referring to FIG. 3 or FIG. 4, the second terminal of the second capacitor C2 is connected with the second negative input terminal of the second comparator through the first diode D2. The second output terminal of the second comparator is connected with the first voltage dividing circuit 21 through the second diode D3. The second output terminal is further connected with the second voltage dividing circuit 22 through the second diode D3. The unidirectional conduction of the circuit is ensured by arranging the first diode D2 and the second diode D3, so as to ensure normal operation of the circuit.

Since the output signal of the temperature sensor might form a spike due to instability, in order to prevent the spike from damaging the temperature detection circuit, the temperature detection circuit may further comprise an amplitude limiter 5. The first negative input terminal of the first comparator is connected with the output terminal of the amplitude limiter 5, and the first negative input terminal of the first comparator is connected with the output terminal of the temperature sensor through the amplitude limiter 5. The output signal of the temperature sensor is inputted to the first comparator 1 again after being limited by the amplitude limiter 5, thereby eliminating the spike that might occur in the output signal of the temperature sensor, and ensuring the normal operation of the temperature detection circuit.

Specifically, referring to FIG. 3 or FIG. 4, the amplitude limiter 5 may comprise a third diode D4 and a fourth diode D5. The positive pole of the third diode D4 is connected with the first negative input terminal of the first comparator, and the negative pole of the third diode D4 is connected with a third reference voltage terminal Vref3. The negative pole of the fourth diode D5 is connected with the first negative input terminal of the first comparator, and the positive pole of the fourth diode D5 is connected with a fourth reference voltage terminal Vref4. The voltage value of the input signal Uin (i.e., the output signal of the temperature sensor) that enters the amplitude limiter 5 may be kept between the third reference voltage Vref3 output by the third reference voltage terminal and the fourth reference voltage Vref4 output by the fourth reference voltage terminal. Therefore, the spike in the output signal of the temperature sensor is effectively prevented from entering the first comparator 1, which ensures normal operation of the temperature detection circuit. The third reference voltage value output by the third reference voltage terminal Vref3 may be equal to the second reference voltage value output by the second reference voltage terminal Vref2.

As shown in FIG. 4, an embodiment of the present disclosure further provides a temperature sensor device, comprising a temperature sensor 6 and the temperature detection circuit as previously described. The output terminal of the temperature sensor 6 may be connected with the first negative input terminal of the first comparator 1.

The temperature sensor device provided by the embodiment of the present disclosure comprises a temperature detection circuit. In the temperature detection circuit, the first negative input terminal of the first comparator is connected with the output terminal of the temperature sensor, the first positive input terminal is connected with the first reference voltage, the first output terminal is connected with the input terminal of the monostable trigger, and the output terminal of the monostable trigger is connected with the input terminal of the low pass filter. In this way, the first comparator shapes the output signal of the temperature sensor into a square wave, and the monostable trigger generates a pulse signal having the same frequency as the square wave having a fixed width which is smaller than the width of the square wave. The low pass filter converts the pulse signal with a fixed width into a frequency dependent DC voltage signal, and the processor performs collecting processing on the frequency dependent DC voltage signal, so as to obtain a current temperature. Compared with the prior art, the technical solution provided by the embodiment of the present disclosure discards the conventional way of detecting the temperature by counting, but obtains the temperature value by collecting the voltage signal. Thus, the master clock frequency of the processor is not required, which allows the temperature detection circuit to have a relatively wide frequency collecting range. Even if the output frequency of the temperature sensor is relatively high, the temperature detection circuit may also detect the temperature accurately.

At present, in addition to the AC component formed by oscillation, the signal output by the temperature sensor constituted by the ring oscillator may further contain DC components due to factors such as errors in the manufacturing process of the device per se. Moreover, part of the DC components may vary due to different temperature sensors, which requires the first reference voltage value output by the first reference voltage terminal connected with the first positive input terminal of the first comparator in the temperature detection circuit to be adjusted according to different DC components. In order to solve this problem, the output terminal of the temperature sensor 6 is connected with a high pass filter circuit 7. The output terminal of the temperature sensor 6 may be connected with the first negative input terminal of the first comparator 1 through the high pass filter circuit 7. The DC components in the output signal of the temperature sensor 6 may be filtered through the high pass filter 7, so that the output signal only contains AC components, so that the first positive input terminal of the first comparator 1 only has to be connected with the ground. In this way, when detecting different temperature sensors, it is not necessary to adjust the temperature detection circuit, so that the efficiency is improved and reduce the cost. The high pass filter 7 may also be connected with the input terminal of the amplitude limiter 5, and connected with the first negative input terminal of the first comparator through the amplitude limiter 5. The high pass filter 7 may also be arranged in the temperature detection circuit, so as to implement the function of filtering the DC components in the output signal of the temperature sensor. If the high pass filter is arranged in the temperature detection circuit, the high pass filter will be relatively far away from the temperature sensor. Hence, the detection effect obtained from such a design might be different from the detection effect obtained by arranging the high pass filter on the temperature sensor directly.

Figure 5:
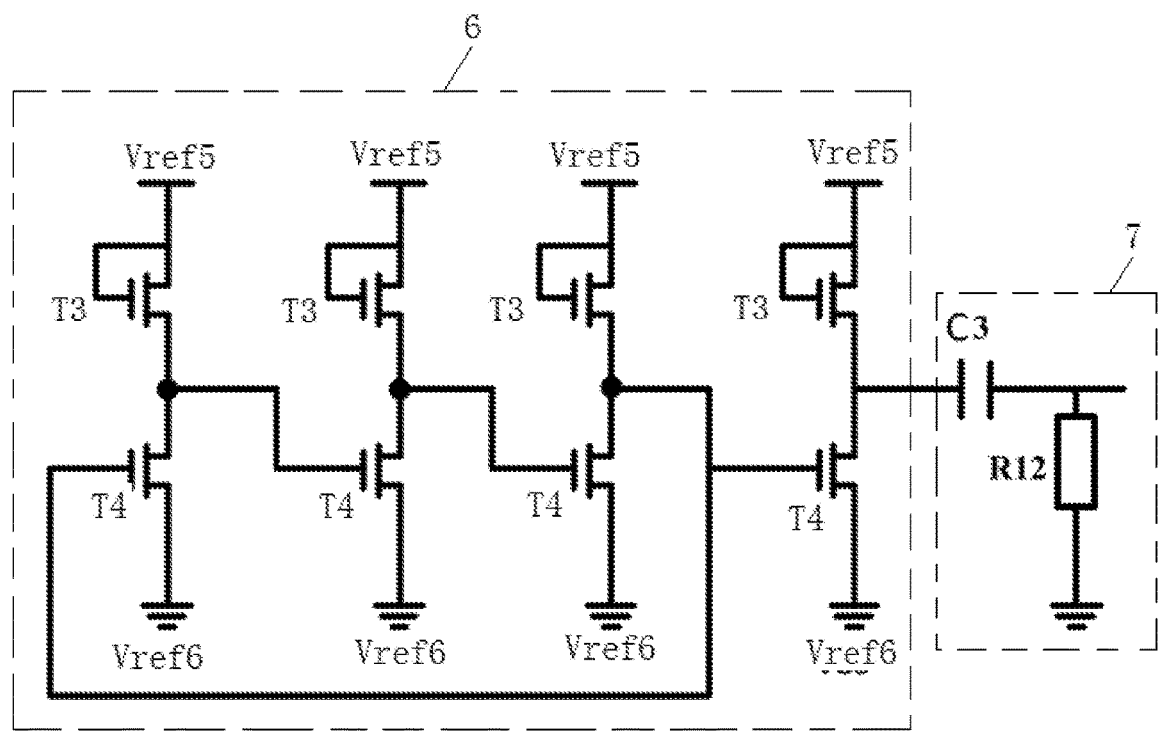
FIG. 5 is a circuit diagram of a high pass filter and a temperature sensor in FIG. 4.

FIG. 5 shows a specific implementation of mutual connection of the temperature sensor 6 and the high pass filter 7. Each inverter in the temperature sensor 6 is constituted by a switch transistor T3 and a switch transistor T4. The specific working principle thereof is the prior art, which will not be repeated herein.

Figure 6:
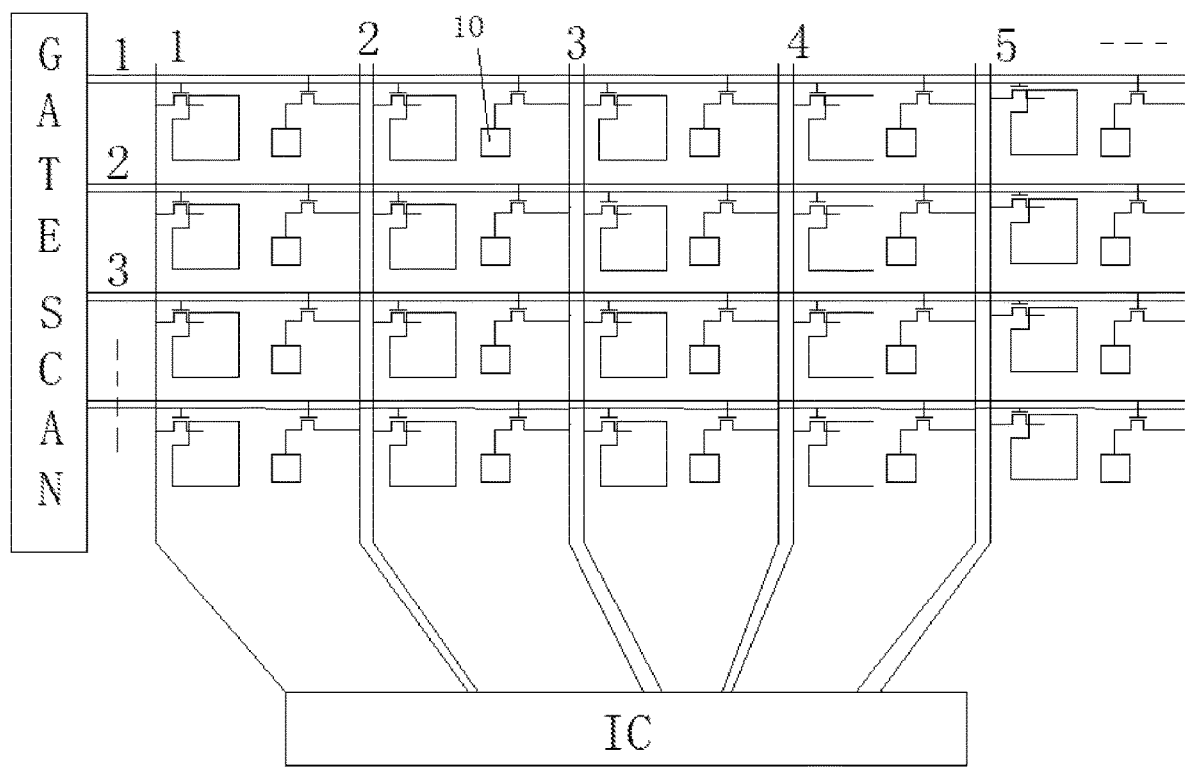
FIG. 6 is a schematic structure diagram of a display device according to an embodiment of the present disclosure.

As shown in FIG. 6, an embodiment of the present disclosure further provides a display device, comprising the temperature sensor device as previously described. The display device may be a display screen. The capacitor of the high pass filter in the temperature sensor may be manufactured in the back plate of thin film transistor of the display screen. The specific manufacturing scheme may take the low temperature polysilicon process as an example, and take the pixel electrode layer, the insulating layer and the common electrode in the back plate as the capacitor. The temperature sensor may be manufactured in the non-display area, for example, the free area in the fan-out area below the display screen, and may also be integrated in the non-display area between the pixel areas. The numeral "10" in FIG. 6 represents the temperature sensor. It should be noted that in such a case, in order to reduce the amount of wirings, a thin film transistor may be added before the temperature sensor is elicited, and a column of temperature sensors may share one read line, so as to read the temperature signal in line by line scanning manner. Moreover, the temperature sensor detection mode in this case may share a read line with display and perform time multiplexing with the display.

The display device provided by the embodiment of the present disclosure comprises a temperature sensor device. The temperature sensor device comprises a temperature detection circuit. The first negative input terminal of the first comparator of this temperature detection circuit is connected with the output terminal of the temperature sensor, and the first positive input terminal is connected with the first reference voltage. The first output terminal is connected with the input terminal of the monostable trigger, and the output terminal of the monostable trigger is connected with the input terminal of the low pass filter. In this way, the first comparator shapes the output signal of the temperature sensor into a square wave, and the monostable trigger generates a pulse signal having the same frequency as the square wave having a fixed width which is smaller than the width of the square wave. The low pass filter converts the pulse signal with a fixed width into a frequency dependent DC voltage signal, and the processor performs collecting processing on the frequency dependent DC voltage signal, so as to obtain a current temperature. Compared with the prior art, the technical solution provided by the embodiment of the present disclosure discards the conventional way of detecting the temperature by counting, but obtains the temperature value by collecting the voltage signal. Thus, the master clock frequency of the processor is not required, which allows the temperature detection circuit to have a relatively wide frequency collecting range. Even if the output frequency of the temperature sensor is relatively high, the temperature detection circuit may also detect the temperature accurately.

What are described above are only specific implementations of the present disclosure. However, the protection scope of the present disclosure is not limited to this. Any modifications or replacements that may be easily conceived by the skilled person familiar with the present technical field within the technical scope disclosed by the present disclosure shall be encompassed within the protection scope of the present disclosure. Therefore, the protection scope of the present disclosure shall be subject to the protection scopes of the claims attached.

What is claimed is:

1. A temperature detection circuit, comprising:
    a first comparator, the first comparator having a first negative input terminal, a first positive input terminal and a first output terminal, the first negative input terminal being connected with an output terminal of a temperature sensor, the first positive input terminal being connected with a first reference voltage terminal;
    a monostable trigger, an input terminal of the monostable trigger being connected directly or through a differential circuit with the first output terminal of the first comparator; and
    a low pass filter, an input terminal of the low pass filter being connected with an output terminal of the monostable trigger,
    wherein the first output terminal of the first comparator is connected with the input terminal of the monostable trigger through the differential circuit, and wherein,
    the monostable trigger comprises a second comparator, a first capacitor, a first thin film transistor, a second thin film transistor and a Zener diode, the second comparator having a second negative input terminal, a second positive input terminal and a second output terminal;
    the second negative input terminal is connected with an output terminal of the differential circuit, the second positive input terminal is connected with a second reference voltage terminal through a first resistor, the second positive input terminal is further connected with a drain of the first thin film transistor through a second resistor, the second positive input terminal is further connected with a ground terminal through the first capacitor, the second output terminal is connected with a gate of the first thin film transistor through a first voltage dividing circuit, the second output terminal is further connected with a gate of the second thin film transistor through a second voltage dividing circuit;
    a source of the first thin film transistor is connected with the ground terminal;
    a drain of the second thin film transistor is connected with the second reference voltage terminal through a third resistor, the drain of the second thin film transistor is further connected with the second negative input terminal through a third voltage dividing circuit, a source of the second thin film transistor is connected with the ground terminal; and
    a positive pole of the Zener diode is connected with the source of the second thin film transistor, and a negative pole of the Zener diode is connected with the drain of the second thin film transistor.

2. The temperature detection circuit according to claim 1, wherein
    the differential circuit comprises a second capacitor and a fourth resistor;
    a first terminal of the second capacitor is connected with the first output terminal of the first comparator, a second terminal of the second capacitor is connected with the second negative input terminal of the second comparator; and
    the fourth resistor is connected between the second terminal of the second capacitor and the ground terminal.

3. The temperature detection circuit according to claim 2, wherein
    the second terminal of the second capacitor is connected with the second negative input terminal of the second comparator through a first diode; and
    the second output terminal of the second comparator is connected with the first voltage dividing circuit through a second diode, and the second output terminal is further connected with the second voltage dividing circuit through the second diode.

4. The temperature detection circuit according to claim 1, further comprising an amplitude limiter;
    wherein the first negative input terminal of the first comparator is connected with an output terminal of the amplitude limiter, and the first negative input terminal is connected with the output terminal of the temperature sensor through the amplitude limiter.

5. The temperature detection circuit according to claim 4, wherein
    the amplitude limiter comprises a third diode and a fourth diode;
    a positive pole of the third diode is connected with the first negative input terminal of the first comparator, and a negative pole of the third diode is connected with a third reference voltage terminal; and
    a negative pole of the fourth diode is connected with the first negative input terminal of the first comparator, and a positive pole of the fourth diode is connected with a fourth reference voltage terminal.

6. A temperature sensor device, comprising:
    a temperature sensor, and
    the temperature detection circuit according to claim 1;
    wherein an output terminal of the temperature sensor is connected with the first negative input terminal of the first comparator.

7. The temperature sensor device according to claim 6, further comprising a high pass filter circuit,
    wherein the output terminal of the temperature sensor is connected with the high pass filter circuit; and
    the output terminal of the temperature sensor is connected with the first negative input terminal of the first comparator through the high pass filter circuit.

8. A display device, comprising:
the temperature sensor device according to claim 6.

9. The temperature sensor device according to claim 6, wherein,
the differential circuit comprises a second capacitor and a fourth resistor;
a first terminal of the second capacitor is connected with the first output terminal of the first comparator, a second terminal of the second capacitor is connected with the second negative input terminal of the second comparator;
the fourth resistor is connected between the second terminal of the second capacitor and the ground terminal.

10. The temperature sensor device according to claim 9, wherein,
the second terminal of the second capacitor is connected with the second negative input terminal of the second comparator through a first diode;
the second output terminal of the second comparator is connected with the first voltage dividing circuit through a second diode, and the second output terminal is further connected with the second voltage dividing circuit through the second diode.

11. The temperature sensor device according to claim 6, further comprising an amplitude limiter;
wherein the first negative input terminal of the first comparator is connected with an output terminal of the amplitude limiter, and the first negative input terminal is connected with the output terminal of the temperature sensor through the amplitude limiter.

12. The temperature sensor device according to claim 11, wherein,
the amplitude limiter comprises a third diode and a fourth diode;
a positive pole of the third diode is connected with the first negative input terminal of the first comparator, and a negative pole of the third diode is connected with a third reference voltage terminal;
a negative pole of the fourth diode is connected with the first negative input terminal of the first comparator, and a positive pole of the fourth diode is connected with a fourth reference voltage terminal.

13. A temperature detection circuit, comprising:
a first comparator, the first comparator having a first negative input terminal, a first positive input terminal and a first output terminal, the first negative input terminal being connected with an output terminal of a temperature sensor, the first positive input terminal being connected with a first reference voltage terminal;
a monostable trigger, an input terminal of the monostable trigger being connected directly or through a differential circuit with the first output terminal of the first comparator; and
a low pass filter, an input terminal of the low pass filter being connected with an output terminal of the monostable trigger,
further comprising an amplitude limiter;
wherein the first negative input terminal of the first comparator is connected with an output terminal of the amplitude limiter, and the first negative input terminal is connected with the output terminal of the temperature sensor through the amplitude limiter, wherein
the amplitude limiter comprises a third diode and a fourth diode;
a positive pole of the third diode is connected with the first negative input terminal of the first comparator, and a negative pole of the third diode is connected with a third reference voltage terminal; and
a negative pole of the fourth diode is connected with the first negative input terminal of the first comparator, and a positive pole of the fourth diode is connected with a fourth reference voltage terminal.

14. The temperature detection circuit according to claim 13, wherein the first output terminal of the first comparator is connected with the input terminal of the monostable trigger through the differential circuit.

15. The temperature detection circuit according to claim 14, wherein,
the monostable trigger comprises a second comparator, a first capacitor, a first thin film transistor, a second thin film transistor and a Zener diode, the second comparator having a second negative input terminal, a second positive input terminal and a second output terminal;
the second negative input terminal is connected with an output terminal of the differential circuit, the second positive input terminal is connected with a second reference voltage terminal through a first resistor, the second positive input terminal is further connected with a drain of the first thin film transistor through a second resistor, the second positive input terminal is further connected with a ground terminal through the first capacitor, the second output terminal is connected with a gate of the first thin film transistor through a first voltage dividing circuit, the second output terminal is further connected with a gate of the second thin film transistor through a second voltage dividing circuit;
a source of the first thin film transistor is connected with the ground terminal;
a drain of the second thin film transistor is connected with the second reference voltage terminal through a third resistor, the drain of the second thin film transistor is further connected with the second negative input terminal through a third voltage dividing circuit, a source of the second thin film transistor is connected with the ground terminal; and
a positive pole of the Zener diode is connected with the source of the second thin film transistor, and a negative pole of the Zener diode is connected with the drain of the second thin film transistor.

16. The temperature detection circuit according to claim 15, wherein
the differential circuit comprises a second capacitor and a fourth resistor;
a first terminal of the second capacitor is connected with the first output terminal of the first comparator, a second terminal of the second capacitor is connected with the second negative input terminal of the second comparator; and
the fourth resistor is connected between the second terminal of the second capacitor and the ground terminal.

17. The temperature detection circuit according to claim 16, wherein
the second terminal of the second capacitor is connected with the second negative input terminal of the second comparator through a first diode; and
the second output terminal of the second comparator is connected with the first voltage dividing circuit through a second diode, and the second output terminal is further connected with the second voltage dividing circuit through the second diode.

18. A temperature sensor device, comprising:
a temperature sensor, and
the temperature detection circuit according to claim 13;

wherein an output terminal of the temperature sensor is connected with the first negative input terminal of the first comparator.

19. The temperature sensor device according to claim 18, further comprising a high pass filter circuit,
   wherein the output terminal of the temperature sensor is connected with the high pass filter circuit; and
   the output terminal of the temperature sensor is connected with the first negative input terminal of the first comparator through the high pass filter circuit.

20. A display device, comprising:
   the temperature sensor device according to claim 18.

* * * * *